United States Patent [19]

Nagai et al.

[11] Patent Number: 4,833,510

[45] Date of Patent: May 23, 1989

[54] SEMICONDUCTOR LASER ARRAY WITH INDEPENDENTLY USABLE LASER LIGHT EMISSION REGIONS FORMED IN A SINGLE ACTIVE LAYER

[75] Inventors: Yutaka Nagai; Yutaka Mihashi; Kenji Ikeda, all of Itami, Japan

[73] Assignee: Mitsubishi Denki Kabushiki Kaisha, Tokyo, Japan

[21] Appl. No.: 97,736

[22] Filed: Sep. 17, 1987

[30] Foreign Application Priority Data

Sep. 17, 1986 [JP] Japan .................................. 61-220226

[51] Int. Cl.[4] ............................................ H01L 33/00
[52] U.S. Cl. ........................................ 357/17; 357/55; 357/16; 357/45; 357/60
[58] Field of Search ...................... 357/17, 55, 16, 45, 357/60

[56] References Cited

U.S. PATENT DOCUMENTS

| | | | |
|---|---|---|---|
| 3,996,492 | 12/1976 | McGroddy | 357/17 X |
| 4,326,176 | 4/1982 | Aiki et al. | 357/17 X |
| 4,630,279 | 12/1986 | Kasimura et al. | 357/17X |
| 4,667,332 | 5/1987 | Mihashi et al. | 372/45 |
| 4,750,184 | 6/1988 | Kumabe | 372/45 |

OTHER PUBLICATIONS

Mihashi et al, "A Novel Self-Aligned AlGaAs Laser with Bent Active Layer Grown by MOCVD", *IEDM*, Dec. 1985, 646-49.

"Twin Beam Laser Diode for Optical Disk Memory", by R. Hattori et al., Mitsubishi Electric Corporation.

*Primary Examiner*—Andrew J. James
*Assistant Examiner*—William A. Mintel
*Attorney, Agent, or Firm*—Birch, Stewart, Kolasch & Birch

[57] ABSTRACT

A semiconductor laser array includes a pair of regions of an active layer for emitting laser lights being provided so as to produce a predetermined angle therebetween; the respective regions of the active layer being provided so as to have TE wave electric field vectors of different directions from each other in a plane vertical to the emitting direction of the output laser light. As such, laser light emitted from each of the active layer regions can be used independently without interference from the other.

3 Claims, 3 Drawing Sheets

F I G .1.
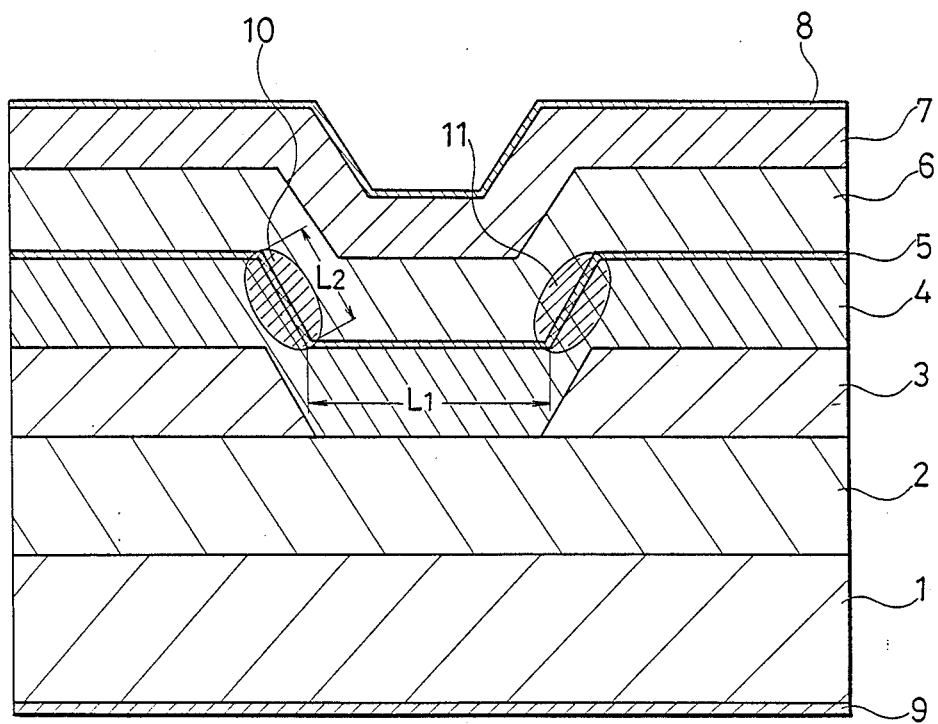

SEMICONDUCTOR LASER ARRAY WITH INDEPENDENTLY USABLE LASER LIGHT EMISSION REGIONS FORMED IN A SINGLE ACTIVE LAYER

FIELD OF THE INVENTION

The present invention relates to a semiconductor laser array and a method of producing same.

BACKGROUND ART

FIG. 5 shows a structure of a prior art semiconductor laser array. The reference numeral 1 designates a p type GaAs semiconductor substrate. The numeral 8 designates an n type electrode. The numeral 9 designates a p type electrode. The numeral 13 designates a current blocking layer comprising n type GaAs, the numeral 14 designates a cladding layer comprising p type $Al_{0.45}Ga_{0.55}As$, the numeral 15 designates an active layer comprising p type $Al_{0.15}Ga_{0.85}As$, the numeral 16 designates a cladding layer comprising n type $Al_{0.45}Ga_{0.55}As$, and the numeral 18 designates a laser light spot obtained in the laser oscillation state.

In a semiconductor laser array of such a structure, the p type semiconductor substrate 1, the n type current blocking layer 13, and the p type cladding layer 14 are constituted to produce a p-n-p conductivity type structure, and thus the current is blocked. The current only flows concentratedly through the stripe groove portion of the current blocking layer 13, and as a result a laser oscillation occurs at the region of the active layer 15 above the stripe groove. In other words, a semiconductor laser array of two point light emission can be produced by producing two stripe grooves in an element.

Generally, the laser light of a semiconductor laser is polarized in a TE wave having an electric field vector in a direction parallel to the active layer 15 in a plane vertical to the advancing direction of the laser beam, and there exists almost no TM wave component having an electric field vector in the direction vertical thereto. Accordingly, when a two point light emission array structure is constituted in a semiconductor laser having an active layer 15 whose surface is flat and is parallel with the substrate 1, the TE waves of the respective laser lights are perfectly directed in the same direction. Furthermore, in this structure the active layer 15 continues linearly between the two stripe grooves, this active layer portion functioning as a waveguide of the laser light.

When the two stripe grooves are provided adjacent to each other within about 10 micron, the two laser lights coincide with each other in the TE wave direction, and thus both laser lights are optically combined with each other. Accordingly, there occurs a so-called phase synchronous oscillation in which oscillations are conducted at the same wavelengths with a constant phase relation.

In such a prior art semiconductor laser array, if the distance between the two laser light spots is reduced to below 10 micron, it is difficult to utilize the two laser lights independently.

SUMMARY OF THE INVENTION

An object of the present invention is to provide a semiconductor laser array and a method of producing the same capable of utilizing a plurality of laser light spots separately and independently.

Other objects and advantages of the present invention will become apparent from the detailed description given hereinafter; it should be understood, however, that the detailed description and specific embodiments are given by way of illustration only, since various changes and modifications within the spirit and scope of the invention will become apparent to those skilled in the art from this detailed description.

According to the present invention, there is provided a semiconductor laser array including a plurality of semiconductor lasers in a single chip which comprises: a pair of regions of an active layer emitting laser lights provided so as to produce a predetermined angle therebetween; the respective regions of the active layer being provided so as to have electric field vectors of different directions from each other in a plane vertical to the advancing direction of the output laser light.

BRIEF DESCRIPTION OF THE DRAWINGS

FIG. 1 is a cross-sectional view of a semiconductor laser array of one embodiment of the present invention;

DETAILED DESCRIPTION OF THE PREFERRED EMBODIMENTS

In order to explain the present invention in detail, reference will be particularly made to FIG. 1.

Figure 5:
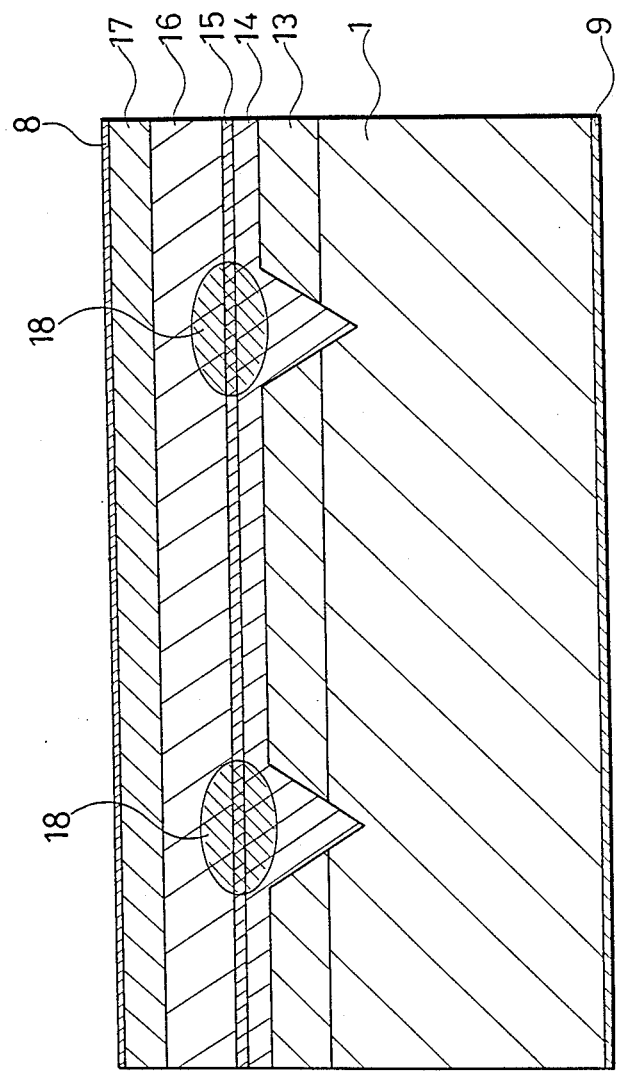
FIG. 5 is a cross-sectional view of a prior art semiconductor laser array.

In FIG. 1, the same reference numerals designate the same elements as those shown in FIG. 5. The reference numeral 2 designates a first cladding layer comprising p type $Al_{0.50}Ga_{0.05}As$, the numeral 3 designates a current blocking layer comprising n type GaAs, the numeral 4 designates a second cladding layer comprising p type $Al_{0.50}Ga_{0.50}As$, the numeral 5 designates an active layer comprising undoped $Al_{0.50}Ga_{0.50}As$, the numeral 6 designates a third cladding layer comprising n type $Al_{0.50}Ga_{0.50}As$, the numeral 7 designates a contact layer comprising n type GaAs, the numeral 10 designates a laser spot generated at the region of the (111) surface of the active layer 5, the numeral 11 designates a laser spot generated at the region of the $(1\bar{1}\bar{1})$ surface of the active layer 5, the character $L_1$ designates the width of the active layer 5 confronting the (100) surface of the stripe groove, and the character $L_2$ designates the width of the active layer 5 confronting the (111) surface of the stripe groove.

Figure 3:
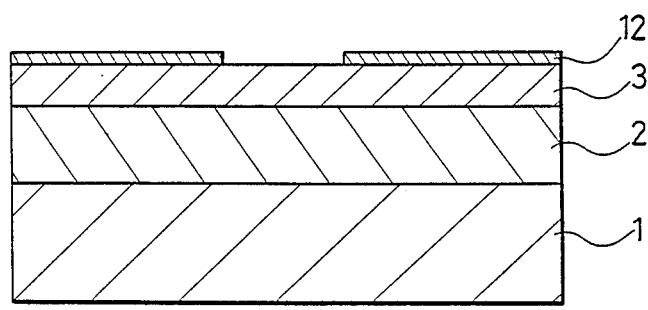
Figure 4:
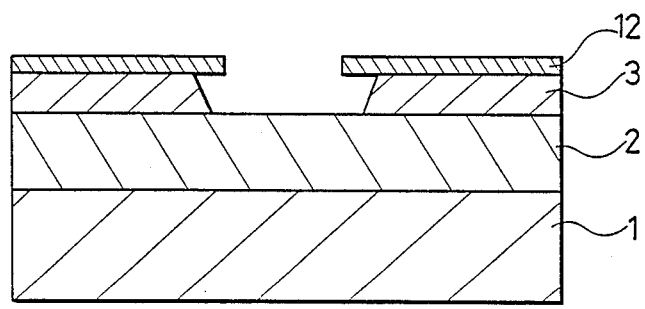

A method of producing a semiconductor laser array will be described with reference to FIGS. 2 to 4.

Figure 2:
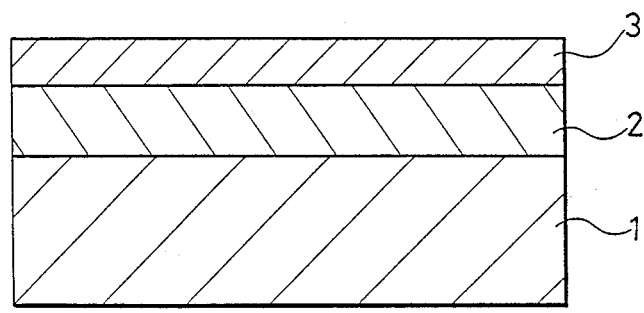
FIGS. 2 to 4 are cross-sectional views explaining a method of producing a semiconductor laser array as shown in FIG. 1.

As shown in FIG. 2, a first cladding layer 2 and a current blocking layer 3 are respectively grown on the (100) surface of the substrate 1 by crystal growth. Next, a resist film 12 is produced on the current blocking layer 3, and 2 to 7 micron of film 12 in a stripe configuration are removed by a photolithography technique as shown in FIG. 3. Next, a stripe groove having trapezoid cross section is produced by etching as shown in FIG. 4. A mixture solution of ammonia and hydrogen peroxide having a GaAs etching speed of more than 10 times as that of $Al_xGa_{l-x}As$ ($x > 0.35$) as an etchant can be utilized so as to easily remove only the current blocking layer.

Then, the surface direction of the bottom surface of the stripe groove is (100), the same as the upper surface of the substrate 1, and the surface directions of the sloped surfaces are (111) and (1$\bar{1}$1), respectively.

Next, the resist film 12 is removed, and a second cladding layer 2, an active layer 5, a third cladding layer 6, and a contact layer 7 are successively grown on the first cladding layer 2 and current blocking layer 3 to form a structure as shown in FIG. 1. A MO-CVD method can be utilized so as to grow the respective layers in configurations corresponding to the configurations of the stripe groove. Thus, the active layer 5 is facing the (100) surface at the bottom of the stripe groove 5 and facing (111) and (1$\bar{1}$1) surfaces, respectively, at the sloped surface portions thereof.

The device will be operated as follows.

When a positive voltage and a negative voltage are applied to the p type electrode and the n type electrode, respectively, current is generally blocked because the p type first cladding layer 2, the n type current blocking layer 3, and the p type second cladding layer 4 are provided to constitute a p-n-p structure. As a result, a current only flows through the portion at the stripe groove where the current blocking layer 3 does not exist. Furthermore, the active layer 5 has a smaller energy band gap than the second and third cladding layers and has a larger refractive index. Accordingly, the light generated by the recombination of electrons and holes injected into the active layer 5 is also confined with in the active layer 5. The confined light is amplified by reciprocating between the resonator end surfaces constituted by both cleavage planes. Laser oscillation occurs when the light amplification overcomes the total loss including the reflection loss due to a portion of the light being absorbed into the second and third cladding layers 4, 6 because of the less than 100% reflectivity of the light advancing from the active layer 5 to the second and third cladding layers 4, 6 and the absorption and scattering loss which occur in the transmission of the light in the active layer 5.

The shorter the width of the active layer 5, that is, the smaller the area of the active layer becomes, the lower the current value at which laser oscillation occurs, that is, the smaller the threshold current becomes. Accordingly, in this structure, when there is a relation of $L_1 < 2L_2$ between the width $L_1$ of the active layer 5 at the region confronting the (100) surface at the bottom of the stripe groove and the sum $2L_2$ of the width of the region of the active layer 5 confronting the (111) and (1$\bar{1}$1) surfaces at the sloped surfaces of the stripe groove, an oscillation at the region of the active layer 5 confronting the (100) surface occurs because this region is easier to oscillate at a low threshold current than the regions confronting the (111) and (1$\bar{1}$1) surface of the active layer 5. To the contrary, when there is a relation of $L_1 > 2L_2$ the regions of the active layer 5 confronting the (111) and (1$\bar{1}$1) surfaces are easier to oscillate at a low threshold current than the region of the active layer 5 confronting the (100) surface. Thus, when the (100) surface is made sufficiently large a semiconductor laser array of multi-point light emission is easily obtained. Herein, the (111) and (1$\bar{1}$1) surfaces produce an angle of about 70° when GaAs is used. As described above, the laser light of a semiconductor laser has almost no TM wave component and the TE wave has an electric field vector in a direction parallel to the active layer 5 in a plane vertical to the advancing direction of the laser light. Accordingly, the layer lights generated at each of the regions of the active layer 5 confronting the (111) and (1$\bar{1}$1) surfaces do not enter into the other regions, and even if they enter, the only influences are due to components of cos 70° because the polarization surfaces are provided so as to produce an angle of 70°. In other words, one light emission does not interfere the other, and the laser lights are easily used independently.

Accordingly, as long as the condition that $L_1 > 2L_2$ is held, output laser lights which do not interfere with each other can be obtained even if the active layers 5 confronting the (111) and (1$\bar{1}$1) surfaces are provided adjacent to each other.

In the above illustrated embodiment when there is a relation of $L_1 < 2L_2$ laser light emission occurs only through the region of the active layer confronting the (100) surface. However, even in a case where a relation of $L_1 < 2L_2$ exists it is possible to make the current concentratedly flow through only the regions confronting the (111) and (1$\bar{1}$1) surfaces rather than through the region confronting the (100) surface by raising the resistance of this region of active layer 5 by, for example, proton ion injection. Thus, a semiconductor laser of multi-point light emission having very closely positioned two light emission regions can be obtained.

In the above-illustrated embodiment a stripe groove is produced in the light guiding direction, and a second cladding layer, an active layer, a third cladding layer, and a contact layer are produced in the configurations corresponding to the stripe groove, but a stripe ridge may be provided to produce the respective layers in configurations corresponding to the stripe ridge.

As is evident from the foregoing description, according to the present invention the regions of the active layer provided adjacent to each other emitting laser lights are provided to produce a predetermined angle with each other and to have electric field vectors in different directions to each other in a plane vertical to the advancing direction of the laser light. Thus, it is possible to obtain laser light spots positioned closely to each other within quite a short distance, and it is possible to utilize the plurality of laser lights independently by separating the respective laser lights such as by using a polarizer.

What is claimed is:

1. A semiconductor laser array, comprising:
   a semiconductor substrate;
   a first cladding layer formed over said substrate;
   a current blocking layer, a second cladding layer and an active layer respectively formed over said first cladding layer,
   said current blocking layer, second cladding layer and active layer including a stripe groove at a central portion thereto, said stripe groove having a bottom surface parallel to said first cladding layer and two sloped side surfaces having a predetermined angle therebetween;
   the length of said bottom surface being longer than the sum of the lengths of said sloped side surfaces to form laser light emitting regions in said active layer at said sloped side surfaces.

2. The semiconductor laser array of claim 1, wherein said predetermined angle has a value such that TE wave vectors of laser light emitted from said light emitting regions are in different directions so as not to interfere with each other.

3. The semiconductor laser array of claim 1, wherein a portion of said active layer facing said bottom surface has a higher resistance than the remainder of said active layer.

* * * * *